United States Patent
Murschall et al.

(10) Patent No.: US 6,855,758 B2
(45) Date of Patent: Feb. 15, 2005

(54) HYDROLYSIS-RESISTANT, TRANSPARENT, BIAXIALLY ORIENTED FILM MADE FROM A CRYSTALLIZABLE THERMOPLASTIC, AND PROCESS FOR ITS PRODUCTION

(75) Inventors: Ursula Murschall, Nierstein (DE); Ulrich Kern, Ingelheim (DE); Thorsten Kiehne, Wiesbaden (DE); Harald Hessberger, Waldems (DE)

(73) Assignee: Mitsubishi Polyester Film GmbH, Wiesbaden (DE)

( * ) Notice: Subject to any disclaimer, the term of this patent is extended or adjusted under 35 U.S.C. 154(b) by 85 days.

(21) Appl. No.: 09/882,596

(22) Filed: Jun. 15, 2001

(65) Prior Publication Data

US 2002/0065346 A1 May 30, 2002

(30) Foreign Application Priority Data

Sep. 29, 2000 (DE) ........................ 100 48 721
Sep. 29, 2000 (DE) ........................ 100 48 720
Apr. 4, 2001 (EP) .......................... 01108497

(51) Int. Cl.$^7$ ........................ C08K 5/353; C08K 5/29
(52) U.S. Cl. .................... 524/195; 524/147; 524/153; 524/348; 524/349; 524/351; 524/353; 524/95; 428/349; 428/355 EN; 428/480; 428/516; 428/910
(58) Field of Search ................. 524/95, 195, 147, 524/153, 348–349, 351–353; 428/349, 355 EN, 480, 516, 910

(56) References Cited

U.S. PATENT DOCUMENTS

| | | | | |
|---|---|---|---|---|
| 4,203,888 A | * | 5/1980 | Rashbrook ................. 524/127 |
| 4,264,667 A | * | 4/1981 | Murakami et al. .......... 428/195 |
| 4,390,683 A | * | 6/1983 | Yatsu et al. ................ 528/194 |
| 4,399,179 A | | 8/1983 | Minami et al. |
| 4,517,315 A | * | 5/1985 | Matsumura et al. ......... 521/64 |
| 5,138,024 A | * | 8/1992 | Brozek et al. .............. 528/272 |
| 5,262,460 A | * | 11/1993 | Suzuki et al. .............. 524/135 |
| 5,302,427 A | * | 4/1994 | Murschall et al. ......... 428/34.2 |
| 5,324,467 A | * | 6/1994 | Anderson, II .......... 264/173.15 |
| 5,366,796 A | * | 11/1994 | Murschall et al. .......... 428/216 |
| 5,427,842 A | * | 6/1995 | Bland et al. ................ 428/213 |
| 5,429,862 A | * | 7/1995 | Schuhmann et al. ........ 428/215 |
| 5,433,983 A | * | 7/1995 | Schuhmann et al. ....... 428/35.7 |
| 5,468,527 A | * | 11/1995 | Peiffer et al. ............. 428/35.7 |
| 5,529,843 A | * | 6/1996 | Dries et al. ................. 428/336 |
| 5,554,245 A | * | 9/1996 | Schuhmann et al. ... 156/244.24 |
| 5,733,959 A | * | 3/1998 | Heitz et al. ................. 524/195 |
| 5,804,626 A | | 9/1998 | Rogers et al. |
| 5,914,079 A | * | 6/1999 | Peiffer et al. ................. 264/80 |
| 6,001,464 A | * | 12/1999 | Schultze et al. ............. 428/220 |
| 6,126,860 A | * | 10/2000 | Imashiro et al. ............ 252/390 |
| 6,218,023 B1 | * | 4/2001 | DeNicola et al. ........... 428/515 |
| 6,355,336 B1 | * | 3/2002 | Wakabayashi et al. ...... 428/215 |
| 6,497,965 B1 | * | 12/2002 | Longmoore et al. ........ 428/515 |
| 6,569,515 B2 | * | 5/2003 | Hebrink et al. ............. 428/212 |
| 6,613,819 B2 | * | 9/2003 | Johnson et al. ............. 524/100 |

FOREIGN PATENT DOCUMENTS

| | | |
|---|---|---|
| DE | 23 46 787 A1 | 3/1975 |
| DE | 41 29 980 A1 | 3/1993 |
| DE | 196 30 599 A1 | 2/1998 |
| EP | 0 035 835 A1 | 9/1981 |
| EP | 0 144 878 A2 | 6/1985 |
| EP | 0 432 886 A2 | 6/1991 |
| EP | 0 515 096 A2 | 11/1992 |
| EP | 0 803 538 A2 | 10/1997 |
| GB | 1 465 973 A1 | 3/1977 |
| WO | WO 98/06575 A1 | 2/1998 |

\* cited by examiner

*Primary Examiner*—Peter Szekely
(74) *Attorney, Agent, or Firm*—ProPat, L.L.C.

(57) ABSTRACT

The invention relates to transparent, biaxially oriented and heat-set films having one or more layers and compris, as main constituent, at least one crystallizable thermoplastic, in particular a polyester, and also comprise at least one hydrolysis stabilizer. The hydrolysis stabilizer is preferably a phenolic compound, an oxazoline, and/or a monomeric or polymeric carbodiimide, where appropriate combined with an organic phosphite. It is preferably added in the form of a masterbatch. The film exhibits low longitudinal and transverse shrinkage. On exposure to moisture and heat it shows practically no embrittlement and retains its ultimate tensile strength. The additional functionality is preferably that the film has been made UV-resistant, or flame-retardant, or on one side or on both sides has been coated, or is sealable, and/or has been corona- or flame-treated. The film is generally produced by extrusion or coextrusion, the hydrolysis stabilizer being added in the form of a predried or precrystallized masterbatch.

21 Claims, No Drawings

US 6,855,758 B2

HYDROLYSIS-RESISTANT, TRANSPARENT, BIAXIALLY ORIENTED FILM MADE FROM A CRYSTALLIZABLE THERMOPLASTIC, AND PROCESS FOR ITS PRODUCTION

BACKGROUND OF THE INVENTION

1. Field of the Invention

The invention relates to a transparent, biaxially oriented and heat-set film having one or more layers and comprising, as main constituent, at least one crystallizable thermoplastic. It further relates to the use of the film and to a process for its production.

2. Description of the Related Art

Transparent, biaxially oriented films made from crystallizable thermoplastics, in particular from crystallizable polyesters, are known and have been described on many occasions.

For example, U.S. Pat. No. 4,399,179 discloses a polyester film laminate with a biaxially oriented, transparent base layer and with at least one monoaxially or biaxially oriented, matt outer layer, the matt layer essentially consisting of a polyethylene terephthalate copolymer having units derived from oligo- or polyethylene glycol, with inert particles. The particles (preferably of silica, kaolin, talc, zinc oxide, aluminum oxide, calcium carbonate or barium sulfate) mostly have diameters of from 0.3 to 20 $\mu$m. The proportion of these in the outer layer is generally from 3 to 40% by weight. Base layer and/or outer layer may moreover comprise antioxidants, UV absorbers, pigments, or dyes. The particle-roughened surface of the outer layer is writable.

The biaxially oriented and heat-set polyester film of GB-A 1 465 973 has more than one layer and encompasses a layer made from transparent polyethylene terephthalate and a layer made from a copolyester, which is likewise transparent. Rollers can be used to give the surface of the copolyester layer a rough structure, making the film writable.

EP-A 035 835 describes a biaxially oriented and heat-set polyester film having more than one layer, encompassing a layer made from a highly crystalline polyester and, bonded thereto, a sealable layer made from a substantively amorphous, linear polyester. The latter layer comprises finely distributed particles, the average diameter of the particles being greater than the thickness of the layer. These particles form surface protrusions which prevent undesirable blocking or adherence to rolls or guiding systems. The result is better winding and processing of the film. The sealing performance of the film is impaired by choosing particles whose diameter is greater than the thickness of the sealable layer, at the concentrations given in the examples. The sealed seam strength of the sealed film at 140° C. is in the range from 63 to 120 N/m (0.97 N/15 mm to 1.8 N/15 mm of film width).

EP-A 432 886 describes a coextruded film with a polyester base layer, and with an outer layer made from a sealable polyester, and with a reverse-side polyacrylate coating. The sealable outer layer may be composed of a copolyester having units derived from isophthalic acid and terephthalic acid. The reverse-side coating gives the film improved processing performance. The sealed seam strength is measured at 140° C. For a sealable layer of 11 $\mu$m thickness, the sealed seam strength given is 761.5 N/m (11.4 N/15 mm). A disadvantage of the reverse-side acrylate coating is that this side no longer has sealability to the sealable outer layer. The uses of the film are therefore very restricted.

Another coextruded, sealable polyester film having more than one layer is described in EP-A 515 096. The sealable layer additionally comprises pigmentation particles, preferably silica gel particles. The particles may also be applied to the film after extrusion, for example by coating with an aqueous silica gel dispersion. This method is intended to give a film whose sealing properties have been retained and which processes well. The reverse side comprises only very few particles, most of which pass into this layer via the regrind. The sealed seam strength is measured at 140° C. and is above 200 N/m (3 N/15 mm). The sealed seam strength given for a sealable layer of 3 $\mu$m thickness is 275 N/m (4.125 N/15 mm).

WO 98/06575 discloses a coextruded polyester film having more than one layer and encompassing a sealable outer layer and a non-sealable base layer. This base layer may have been built up from one or more layers, the interior layer being in contact with the sealable layer. The other (exterior) layer then forms the second, non-sealable outer layer. Here too, the sealable outer layer may be composed of copolyesters having units derived from isophthalic acid and terephthalic acid. However, no antiblocking particles are present in the outer layer. The film also comprises at least one UV absorber, present in a proportion of from 0.1 to 10% by weight in the base layer. The UV absorbers used in this instance are zinc oxide particles or titanium dioxide particles, in each case with an average diameter below 200 nm, but preferably triazines, e.g. ®Tinuvin 1577 from Ciba. The base layer has conventional antiblocking agents. The film has good sealability, but not the desired processing performance, and also has shortcomings in its optical properties.

Layers made from copolyester can be produced by applying an appropriate aqueous dispersion. For example, EP 144 878 describes a polyester film which, on at least one side, has a continuous coating made from the copolyester. The dispersion is applied to the film prior to orientation or, respectively, prior to the final step of orientation. The polyester coating is composed of a condensation product of various monomers capable of forming polyesters, for example isophthalic acid, aliphatic dicarboxylic acids, sulfomonomers, and aliphatic or cycloaliphatic glycols.

DE-A 23 46 787 discloses, inter alia, flame-retardant films made from linear polyesters, modified with carboxyphosphinic acids. However, production of these films is attended by a variety of problems, for example the raw material is very susceptible to hydrolysis and requires very thorough predrying. When the raw material is dried using prior art dryers it cakes, and production of a film, is possible only under very difficult conditions. The films produced, under extreme and uneconomic conditions, also embrittle at high temperatures. The associated decline in mechanical properties is so severe as to make the film unusable. This embrittlement arises after as little as 48 hours at high temperature.

Prior art films are generally insufficiently resistant to aqueous media, and they, and the products produced from them, are therefore unsuitable for applications in contact with moisture or water. Here, again, mechanical properties deteriorate to the extent that the films can become completely unusable.

SUMMARY OF THE INVENTION

It was therefore an object of the invention to provide a transparent, biaxially oriented and heat-set film which has good mechanical and optical properties and low shrinkage, and exhibits no embrittlement on exposure to high temperatures, and is cost-effective to produce and has the greatest possible resistance to water or moisture.

It has now been found that this object can be achieved by incorporating at least one hydrolysis stabilizer. Surprisingly, there is no resultant loss of optical or mechanical properties in the film.

The present invention therefore provides a transparent, biaxially oriented film having one or more layers and comprising, as main constituent, at least one crystallizable thermoplastic, wherein the film comprises at least one hydrolysis stabilizer.

Compounds effective as hydrolysis stabilizers are firstly those which suppress or retard the hydrolysis of ester bonds. Examples of these are phenolic stabilizers. These include sterically hindered phenols, thiobisphenols, alkylidene-bisphenols, alkylphenols, hydroxybenzoyl compounds, acylaminophenols, and hydroxyphenyl propionates (in particular the 3,5-di-tert-butyl-4-hydroxyphenyl propionates of pentaerythritol and of 1-octadecanol, obtainable as ®Irganox from Ciba Specialty Chemicals). An example of a description of these compounds is found in the monograph "Kunststoffadditive" [Plastics additives] by Gächter and M üller, 2nd edn., Carl Hanser Verlag. The proportion of the phenolic stabilizers is usually from 0.1 to 8.0% by weight, preferably from 0.2 to 5.0% by weight, based in each case on the weight of the film or, respectively, of the layer provided therewith (in the case of the film having more than one layer).

The phenolic stabilizers mentioned are preferably combined with organic phosphites, in particular with triaryl phosphites (for example those obtainable as ®Irgafos 168 from Ciba Specialty Chemicals). These are capable of degrading peroxides and therefore act as secondary stabilizers. The ratio by weight of phenolic stabilizers to organic phosphites here is generally from 10:90 to 90:10. Mixtures of primary and secondary hydrolysis stabilizers are also commercially available, for example as ®Irganox B 561 or ®Irganox B 225.

Other compounds effective as hydrolysis stabilizers are those which can restore bonds previously broken by hydrolysis. Among the compounds suitable for restoring an ester group, starting from a hydroxyl group and a carboxyl group, are monomeric or polymeric carbodiimides (specifically dicyclohexylcarbodiimide or aromatic polymeric carbodiimides, and among the polymeric carbodiimides particular preference is given to those with a molecular weight of from 2000 to 50000, obtainable as ®Stabaxol P from Rhein Chemie GmbH, Mannheim), and also oxazolines. The proportion of these compounds is generally from 0.1 to 5.0% by weight, preferably from 0.2 to 3.0% by weight, based in each case on the weight of the single-layer film or, respectively, of the layer provided therewith within the film having more than one layer.

DETAILED DESCRIPTION OF PREFERRED EMBODIMENTS

One preferred film of the invention comprises compounds which reduce hydrolysis rate and also compounds which can restore ester bonds. It is particularly resistant to moisture or water. In one preferred embodiment, the film therefore comprises from 0.1 to 5% by weight of polymeric aromatic carbodiimides and from 0.1 to 5% by weight of a blend made from 30 to 90% by weight of an organic phosphite (in particular a triaryl phosphite) and 70 to 10% by weight of a hydroxyphenyl propionate.

The proportion of all of the hydrolysis stabilizers together is generally from 0.2 to 16.0% by weight, preferably from 0.5 to 14.0% by weight, based in each case on the weight of the film or, respectively, of the relevant layer of the film having more than one layer.

The absorbance of the hydrolysis stabilizers at wavelength 380–400 nm is practically zero, or only very small when compared with that of UV stabilizers.

The film of the invention has good mechanical properties. These include a high modulus of elasticity (longitudinal or in machine direction (MD) above 3500 N/mm$^2$, preferably above 3800 N/mm$^2$, in the transverse direction (TD) above 4200 N/mm$^2$, preferably above 4500 N/mm$^2$; determined in each case to ISO 527-1-2), and also good ultimate tensile strength (above 100 N/mm$^2$ in MD and above 180 N/mm$^2$ in TD).

The longitudinal and transverse shrinkage can be adjusted over a wide range from 0 to about 5% via appropriate choice of setting temperature and frame geometry. The film preferably has low shrinkage. This means that the shrinkage of the film when it has been heated (DIN 40634) for 15 minutes at 150° C. is below 1.5% both longitudinally and transversely, preferably below 1.3%, particularly preferably below 1.1%. These shrinkage values may be achieved by way of the production process, or else by subsequent off-line post-treatment. In the off-line post-treatment, the film is guided under very little tension through a heating oven, being exposed to a temperature in the range from 160 to 210° C. for a period of from 30 seconds to 2 minutes. During the production process, the shrinkage may be adjusted by adjusting the heat-setting temperature. The heat-setting temperature is from 180 to 260° C., in particular from 220 to 250° C.

The film also has excellent capability of both longitudinal and transverse orientation during its production, without any break-offs. The oriented film generally has a thickness of from 1 to 500 μm, preferably from 5 to 350 μm, particularly preferably from 10 to 300 μm.

The film of the invention also has good hydrolysis resistance. This means that its longitudinal and transverse ultimate tensile strength are above 100 N/mm$^2$ after 1000 hours in an autoclave at 85° C. and 95% relative humidity when subjected to the heat/humidity test (long-term humidity test).

Examples of the good optical properties of the film are high light transmittance (above 80%), low haze (below 30%), and also low Yellowness Index (YI below 10).

The film can also be produced cost-effectively. For example, the raw materials or the components of the raw materials needed to produce the film can be dried using conventional industrial dryers, such as vacuum dryers, fluidized-bed dryers, or fixed-bed dryers (tower dryers), without any caking or thermal degradation.

Nor does the film embrittle on exposure to high temperatures. This means that even after 1000 hours of annealing at 130° C. in a circulating-air oven there is no significant impairment in the mechanical properties of the film. Polyethylene terephthalate films without hydrolysis stabilizers do not meet these requirements.

The film of the invention comprises, as main constituent, a crystallizable thermoplastic, in particular a crystallizable polyester or copolyester. Examples of suitable crystallizable or semicrystalline (co)polyesters are polyethylene terephthalate (PET), polyethylene naphthalate (PEN), polybutylene terephthalate (PBT), bibenzoyl-modified polyethylene terephthalate (PETBB), bibenzoyl-modified polybutylene terephthalate (PBTBB) and bibenzoyl-modified polyethylene naphthalate (PENBB), preference being given to polyethylene terephthalate (PET) and bibenzoyl-modified polyethylene terephthalate (PETBB).

For the purposes of the present invention, crystallizable thermoplastics are crystallizable homopolymers, crystallizable copolymers, crystallizable compounds, crystallizable regrind or any other type of crystallizable thermoplastic.

Alongside the main monomers used in preparing crystallizable, thermoplastic (co)polyesters, for example dimethyl terephthalate (DMT), ethylene glycol (EG), propylene glycol (PG), 1,4-butanediol, terephthalic acid (TA), benzenedicarboxylic acid, and/or naphthalene-2,6-dicarboxylic acid (NDA), use may also be made of isophthalic acid (IPA) and/or cis- and/or trans-1,4-cyclohexanedimethanol (c-CHDM, t-CHDM, or c/t-CHDM).

The standard viscosity SV (DCA) of the polyethylene terephthalate is generally from 600 to 1000, preferably from 700 to 900.

Preferred starting materials for producing the film of the invention are crystallizable thermoplastics with a crystalline melting point Tm of from 180 to 365° C. or above, preferably from 180 to 310° C., and with a crystallization temperature range Tc of from 75 to 280° C., and with a glass transition temperature Tg of from 65 to 130° C. (determined by differential scanning colorimetry (DSC) at a heating rate of 20° C./min) and with a density from 1.10 to 1.45 (determined to DIN 53479), and with a crystallinity of from 5 to 65%, preferably from 20 to 65%.

The bulk density (measured to DIN 53466) is from 0.75 to 1.0 $kg/dm^3$, preferably from 0.80 to 0.90 $kg/dm^3$.

The polydispersity (or Mw:Mn ratio) of the thermoplastic, measured by gel permeation chromatography (GPC) is preferably from 1.5 to 4.0, particularly preferably from 2.0 to 3.5.

"Main constituent" means that the proportion of the at least one semicrystalline thermoplastic is preferably from 50 to 99% by weight, particularly preferably from 75 to 95% by weight, based in each case on the total weight of the film or, respectively, on the total weight of the layer within the film. The remaining content may be made up by the hydrolysis stabilizer and other additives usually used for biaxially oriented, transparent films.

The polyethylene terephthalate film of the invention may have one layer or else more than one layer. In the embodiment having more than one layer, the film is composed of at least one core layer, of at least one outer layer, and, where appropriate, of at least one intermediate layer, and particular preference is given here to an A-B-A or A-B-C three-layer structure. In this embodiment it is important that the standard viscosity of the polyethylene terephthalate of the core layer is similar to that of the polyethylene terephthalate of the outer layer(s) which adjoin(s) the core layer.

In one particular embodiment, the outer layers and/or the intermediate layers of the film having more than one layer may also be composed of a polyethylene naphthalate homopolymer, or of polyethylene terephthalate-polyethylene naphthalate copolymers, or of a compound. In this embodiment, the standard viscosities of the thermoplastics of the outer layers are again similar to that of the polyethylene terephthalate of the core layer.

In the embodiment having more than one layer, the hydrolysis stabilizer(s) is/are preferably present in the base layer. However, depending on requirements, it is also possible for the outer layers and/or any intermediate layers present to have hydrolysis stabilizers, at the concentration stated for the monofilm. Unlike in the single-layer embodiment, the concentration of the stabilizers here is based on the weight of the layer provided with the materials.

The light transmittance L, measured to ASTM D1003, is above 80%, preferably above 82%, and the haze of the film, measured to ASTM D1003, is below 30%, preferably below 25%. This is surprisingly good in view of the hydrolysis resistance achieved.

The film of the invention can moreover be recycled without polluting the environment, and the film produced here from the regrind exhibits practically no impairment of optical properties (in particular Yellowness Index) or mechanical properties, when compared with a film produced from virgin materials.

Besides the hydrolysis stabilizer(s) and the additives described above, the base layer and/or outer layer(s) may also comprise other conventional additives, such as fillers and antiblocking agents. They are advantageously added to the polymer or polymer mixture before melting begins.

Other additives which may be used are mixtures of two or more different antiblocking agents or mixtures of antiblocking agents of the same composition but of different particle size. The particles may be added to the individual layers in the usual proportions, e.g. as a glycolic dispersion, during the polycondensation process, or via masterbatches during extrusion. Pigment concentrations which have proven particularly suitable are from 0.0001 to 10.0% by weight, based on the weight of the outer layers.

For certain applications it can be advantageous to use acids for chemical pretreatment of the surface of the film. Those which are particularly suitable for this "adhesion etching" are trichloroacetic acid, dichloroacetic acid, and hydrofluoric acid. The surface is exposed to these for a short time (from 5 to 120 seconds) and they are then removed by an air knife, the film then has a highly reactive, amorphous surface.

The film of the invention may have at least one further functionality. The additional functionality is preferably that the film has been made UV-resistant, or flame-retardant, or on one side or on both sides has been coated, or is sealable, and/or has been corona- or flame-treated.

One or both sides of the film of the invention may therefore have a coating. The thickness of this coating on the finished film is generally from 5 to 100 nm, preferably from 20 to 70 nm, in particular from 30 to 50 nm. It is preferably applied in-line, i.e. during the film-production process, advantageously prior to transverse orientation. Application by reverse gravure roll coating is particularly preferred, and this process permits extremely uniform application of the coating at the layer thickness mentioned. The coatings are applied—preferably by aqueous methods—as solutions, suspensions, or dispersions, and provide the film surface with additional functionalities of the type mentioned above. Examples of substances or compositions which provide additional functionality are acrylates (see WO 94/13476), ethylvinyl alcohols, PVDC, water glass ($Na_2SiO_4$), hydrophilic polyesters (PET/IPA polyesters containing the sodium salt of 5-sulfoisophthalic acid, as mentioned in EP-A 144 878 or U.S. Pat. No. 4,252,885), copolymers having vinyl acetate units (see WO 94/13481), polyvinyl acetates, polyurethanes, the alkali metal or alkaline earth metal salts of $C_{10}$–$C_{18}$ fatty acids, copolymers having units derived from butadiene and acrylonitrile, methyl methacrylate, methacrylic acid, and/or acrylic acid, and/or esters of these. The substances or compositions which provide the additional functionality may be the usual additives, such as antiblocking agents and/or pH stabilizers, in amounts of from 0.05 to 5% by weight, preferably from 0.1 to 3% by weight.

The compositions or substances mentioned are applied in the form of dilute, preferably aqueous, solution, emulsion, or dispersion to one or both sides of the film. The solvent is then removed. If the coatings are applied in-line prior to transverse stretching, the heat treatment prior to transverse stretching is usually sufficient to evaporate the solvent and dry the coating. The dried coatings then have layer thicknesses of from 5 to 100 nm, preferably from 20 to 70 nm, in particular from 30 to 50 nm.

The film of the invention may also have been made UV-resistant. Light, in particular the ultraviolet content of solar radiation, i.e. the wavelength region from 280 to 400 nm, causes degradation in thermoplastics, the results of which are not only a change in appearance due to color change or yellowing but also an extremely adverse effect on the mechanical and physical properties of films made from these thermoplastics. The suppression of this photooxidative degradation is of considerable industrial and economic importance, since without it many thermoplastics have drastically reduced scope of application. The absorption of UV light by polyethylene terephthalates, for example, start below 360 nm, increasing markedly below 320 nm, and is very pronounced below 300 nm. Maximum absorption occurs at between 280 and 300 nm. In the presence of oxygen it is mainly chain cleavage which is observed, but without any crosslinking. The predominant photooxidation products in quantity terms are carbon monoxide, carbon dioxide and carboxylic acids. Besides direct photolysis of the ester groups, attention has to be paid to oxidation reactions which proceed via peroxide radicals, again to form carbon dioxide. In photooxidation of polyethylene terephthalates there can also be cleavage of hydrogen at the position a to the ester groups, giving hydroperoxides and decomposition products of these, and this may be accompanied by chain cleavage (H. Day, D. M. Wiles, *J. Appl. Polym. Sci.* 16 [1972] p. 203).

UV stabilizers, i.e. light stabilizers which are UV absorbers, are chemical compounds which intervene in the physical and chemical processes of light-induced degradation. Carbon black and other pigments can give some protection from light, but these substances are unsuitable for transparent films, since they cause discoloration or color change. UV stabilizers which are suitable light stabilizers are those which absorb at least 70%, preferably at least 80%, particularly preferably at least 90%, of the UV light in the wavelength region from 180 to 380 nm, preferably from 280 to 350 nm. These are particularly suitable if they are thermally stable, i.e. do not decompose into cleavage products, nor cause any evolution of gas, in the temperature range from 260 to 300° C. Examples of UV stabilizers which are suitable light stabilizers are 2-hydroxybenzophenones, 2-hydroxybenzotriazoles, organonickel compounds, salicylic esters, cinnamic ester derivatives, resorcinol monobenzoate, oxanilides, hydroxybenzoic esters, benzoxazinones, sterically hindered amines and triazines, preference being given to the 2-hydroxybenzotriazoles, the benzoxazinones and the triazines. For the skilled worker it was highly surprising that the use of UV stabilizers in combination with hydrolysis stabilizers leads to useful films with excellent properties.

There are UV stabilizers known from the literature which absorb UV radiation and therefore provide protection. The skilled worker would then probably have used one of these known and commercially available UV stabilizers, but in doing this would have found that the UV stabilizer lacks thermal stability and evolves gases or decomposes at temperatures from 200 to 240° C. In order to prevent damage to the film, the skilled worker would have had to incorporate large amounts (from about 10 to 15% by weight) of UV stabilizer, so that the UV light is really effectively absorbed by the stabilizer. However, at these high concentrations the film yellows within just a short period after its production. Its mechanical properties are also adversely affected. Extraordinary problems would have been encountered on orientation, for example break-off due to lack of strength, i.e. modulus of elasticity, die deposits, causing variations in profile, roller deposits from the UV stabilizer, an effect which causes impairment of optical properties (excessive haze, adhesion problems, non-uniform surface), and deposits in the stretching and setting frames, dropping onto the film. It was therefore surprising that even low concentrations of the UV stabilizer achieve exceptional UV protection.

In one particularly preferred embodiment, the film of the invention comprises, as UV stabilizer, from 0.1 to 5.0% by weight of 2-(4,6-diphenyl-[1,3,5]-triazin-2-yl)-5-hexyloxyphenol of the formula

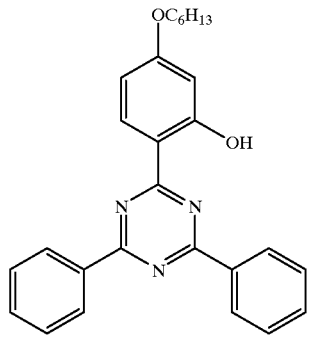

or from 0.1 to 5.0% by weight of 2,2'-methylenebis[6-benzotriazol-2-yl-4-(1,1,2,2-tetramethylpropyl)phenol] of the formula

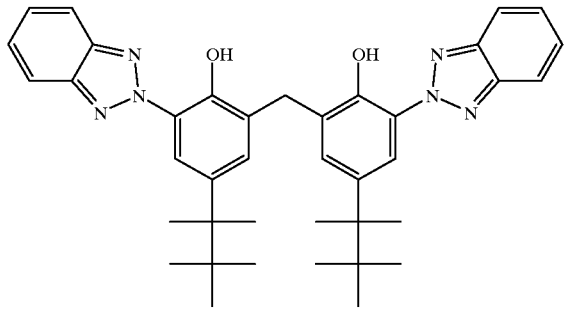

or from 0.1 to 5.0% by weight of 2,2'-(1,4-phenylene)bis ([3,1]benzoxazin-4-one) of the formula

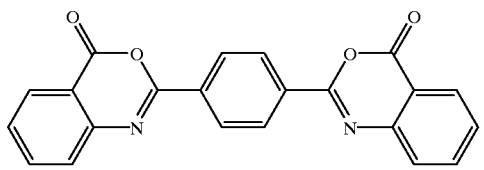

In another embodiment, it is also possible for mixtures of these UV stabilizers to be used, or mixtures of at least one of these UV stabilizers with other UV stabilizers, the total concentration of light stabilizers preferably being from 0.1 to 5.0% by weight, particularly preferably in the range from 0.5 to 3.0% by weight, based on the weight of the layer provided with the materials.

In another embodiment, the film of the invention has been made flame-retardant. For the purposes of the present invention, the term flame retardancy implies that the film complies with the conditions of DIN 4102 Part 2, and in particular the conditions of DIN 4102 Part 1 in tests known as fire-protection tests, and can be assigned to construction materials class B2, and in particular B1, for low-flammability materials. When it is appropriate for the film to be flame-retardant, it should also pass the UL 94 "Burning Test for Flammability of Plastic Material", to the extent that it can be placed in class 94 VTM-0. In this case, the film comprises a flame retardant, which is fed directly by way of what is known as masterbatch technology during film production, the proportion of the flame retardant being in the range from 0.2 to 30.0% by weight, preferably from 0.5 to 25% by weight, particularly preferably from 1.0 to 20.0% by weight, based on the weight of the layer of the crystallizable thermoplastic. The proportion of the flame retardant in the masterbatch is generally from 5 to 60% by weight, preferably from 10 to 50% by weight, based in each case on the total weight of the masterbatch. Examples of suitable flame retardants are bromine compounds, chloroparaffins and other chlorine compounds, antimony trioxide, and alumina trihydrates. However, the halogen compounds have the disadvantage that halogenated byproducts can be produced. In particular, hydrogen halides are produced in the event of a fire. Another disadvantage is that films provided with these materials have low light resistance. Examples of other suitable flame retardants are organic phosphorus compounds, such as carboxyphosphinic acids, anhydrides of these, and dimethyl methanephosphonate. It is important that the organic phosphorus compound is soluble in the thermoplastic, since otherwise the optical properties required are not complied with.

Since the flame retardants generally have some degree of susceptibility to hydrolysis, the additional use of a hydrolysis stabilizer may be advisable.

In this preferred embodiment, the flame-retardant film of the invention comprises, as main constituent, a crystallizable polyethylene terephthalate, from 1 to 20% by weight of an organic phosphorus compound soluble in the thermoplastic, as flame retardant, and from 0.1 to 1.0% by weight of a hydrolysis stabilizer. Dimethyl methanephosphonate is preferred flame retardant. These proportions of flame retardant and hydrolysis stabilizer have proven advantageous when the main constituent of the film is a thermoplastic other than polyethylene terephthalate.

Very surprisingly, fire-protection tests to DIN 4102 and the UL test have shown that in order to provide improved flame retardancy in a three-layer film it is entirely sufficient to provide flame retardants in the outer layers whose thickness is from 0.5 to 2 µm. If required, and if fire-protection requirements are stringent, the core layer may also have what is known as a base level of flame retardants.

Tests have moreover shown that the film of the invention does not embrittle when exposed to temperatures above 100° C. for a prolonged period. This result is attributed to the synergistic effect of appropriate precrystallization, predrying, masterbatch technology, and hydrolysis stabilizer.

If very good sealability is demanded, and if this property cannot be achieved via on-line coating, the film of the invention then has a structure of at least three layers and in one particular embodiment then encompasses the base layer B, a sealable outer layer A, and an outer layer C which may, where appropriate, be sealable. If the outer layer C is also sealable, it is then preferable for the two outer layers to be identical.

The sealable outer layer A applied by coextrusion to the base layer B has a structure based on polyester copolymers and essentially consists of copolyesters composed predominantly of isophthalic acid units, bibenzoyl units, and terephthalic acid units, and of ethylene glycol units. The remaining monomer units derive from the other aliphatic, cycloaliphatic, or aromatic diols and, respectively, dicarboxylic acids which may be present in the base layer. The preferred copolyesters providing the desired sealing properties are those built up from ethylene terephthalate units and ethylene isophthalate units, and from ethylene glycol units. The proportion of ethylene terephthalate is from 40 to 95 mol %, and the corresponding proportion of ethylene isophthalate is from 60 to 5 mol %. Preference is given to copolyesters in which the proportion of ethylene terephthalate is from 50 to 90 mol % and the corresponding proportion of ethylene isophthalate from 50 to 10 mol %, and a high level of preference is given to copolyesters in which the proportion of ethylene terephthalate is from 60 to 85 mol % and the corresponding proportion of ethylene isophthalate is from 40 to 15 mol %.

For the outer layer C which may, where appropriate be sealable, and for any intermediate layers present it is possible in principle to use polymers which are identical to those used in the base layer.

The desired sealing properties and processing properties of the film of the invention are obtained by combining the properties of the copolyester used for the sealable outer layer with the topographies of the sealable outer layer A and of the outer layer C which may, where appropriate be sealable.

The minimum sealing temperature of 110° C. and the sealed seam strength of at least 1.3 N/15 mm are achieved if the copolymers described in some detail above are used for the sealable outer layer A. The best sealing properties are obtained for the film if no other additives are used with the copolymers, in particular no inorganic or organic fillers. This gives the lowest minimum sealing temperature and the highest sealed seam strengths, for a given copolyester. However, it also gives poor film handling, since the surface of the sealable outer layer A is highly susceptible to blocking. The film is almost impossible to wind and is unsuitable for further processing on high-speed packaging machinery. To improve the handling of the film and its processibility, it is necessary to modify the sealable outer layer A. This is best done with the aid of suitable antiblocking agents of selected size, these being added to the sealable layer at a certain concentration and specifically in such a way as firstly to minimize blocking and secondly to give no significant impairment of sealing properties.

If desired, there may also be an intermediate layer between the base layer and the outer layer(s). The intermediate layer may be composed of the polymers described for the base layer. In one particularly preferred embodiment, it is composed of the polyester used for the base layer. It may also comprise conventional additives, besides the hydrolysis stabilizer(s). The thickness of the intermediate layer is generally above 0.3 µm, preferably in the range from 0.5 to 15 µm, in particular from 1.0 to 10 µm.

The thickness of the outer layer(s) is generally above 0.1 µm, preferably in the range from 0.2 to 5 µm, in particular from 0.2 to 4 µm, and the thicknesses of the outer layers may be identical or different.

The total thickness of the polyester film of the invention may vary within wide limits and depends on the intended application. It is preferably from 1 to 500 µm, in particular from 5 to 350 µm, with preference from 100 to 300 µm, the base layer making up from about 40 to 90% of the total thickness.

To establish other desired properties, the film may be corona- or flame-treated. The treatment is generally carried out in such a way that the surface tension of the film is then generally above 45 mN/m.

In another embodiment, the film of the invention has transparent coloring. In this case it comprises at least one dye soluble in the thermoplastic, the proportion of the soluble dye generally being from 0.01 to 20.0% by weight, preferably from 0.05 to 10.0% by weight, based in each case on the weight of the crystallizable thermoplastic. For the purposes of the invention, a soluble dye is a substance which the polymer dissolves at a molecular level (DIN 55949). The color change in the film is based on wavelength-dependent absorption and/or scattering of light. Dyes can only absorb light, and cannot scatter it, since particles have to have a particular size as a physical precondition for scattering. Coloration by a dye is a solution process. The result of this solution process is that the crystallizable thermoplastic, for example, has dissolved the dye at a molecular level. Colorations of this type are termed transparent, translucent, or opaline. Among the various classes of soluble dyes, particular preference is given to dyes soluble in oil or in aromatics. Examples of these are azo dyes and anthraquinone dyes. They are particularly suitable for coloring PET, for example, since the high glass transition temperatures of PET restrict the migration of the dye (see J. Koerner, *Lösliche Farbstoffe in der Kunststoffindustrie* [Soluble dyes in the plastics industry] in "VDI-Gesellschaft Kunststofftechnik:", Einf ärben von Kunststoffen [Dyeing of plastics], VDI-Verlag, D üsseldorf 1975). Examples of suitable soluble dyes are C.I. Solvent Yellow 93 (a pyrazolone derivative), C.I. Solvent Yellow 16 (an oil-soluble azo dye), Fluorol Green Gold (a fluorescent polycyclic dye), C.I. SOLVENT Red 1 (an azo dye), azo dyes such as Thermoplastic Red BS, Sudan Red BB, C.I. SOLVENT Red 138 (an anthraquninone derivative), fluorescent benzopyran dyes, such as Fluorol Red GK and Fluorol Orange GK, C.I. SOLVENT Blue 35 (an anthraquinone dye), C.I. SOLVENT Blue 15:1 (a phthalocyanine dye), and many others. Mixtures of two or more of these soluble dyes are also suitable.

The soluble dye is preferably in the form of a masterbatch when fed to the thermoplastic, but may also be incorporated directly by the raw material producer. The proportion of soluble dye(s) is generally from 0.01 to 40% by weight, preferably from 0.05 to 25% by weight, based in each case on the weight of the crystallizable thermoplastic.

The present invention also provides a process for producing the film. It is generally produced by extrusion or coextrusion, for example on an extrusion line. It has proven particularly advantageous to add the at least one hydrolysis stabilizer in the form of a predried or precrystallized masterbatch, prior to extrusion or coextrusion. The proportion of hydrolysis stabilizer(s) in the masterbatch is generally from 5 to 50% by weight, preferably from 6 to 30% by weight, in each case based on the total weight of the masterbatch. The hydrolysis stabilizer(s) is/are fully dispersed in a carrier material. Carrier materials which may be used are the thermoplastic itself, e.g. polyethylene terephthalate, or else other polymers compatible with the thermoplastic.

In masterbatch technology it is preferable for the grain size and the bulk density of the masterbatches to be similar to the grain size and bulk density of the thermoplastic, so that homogeneous distribution is achieved, resulting in uniform properties.

The polyester films may be produced either as monofilms or else as, where appropriate coextruded, films having more than one layer, by known processes, from polyesters, where appropriate with other raw materials, at least one hydrolysis stabilizer, and also other conventional additives where appropriate (these latter in the usual amounts of from 0.1 to 30% by weight, based on the weight of the film). The surfaces of the films may be identical or different in nature. For example, one surface may comprise particles while the other does not, or all of the layers may comprise particles. One or both surfaces of the film may also be provided with a functional coating, using known processes.

Masterbatches comprising the hydrolysis stabilizer(s) should have been precrystallized or predried. The same applies to masterbatches comprising flame retardants or UV stabilizer(s). This predrying includes gradual heating of the masterbatches at reduced pressure (from 20 to 80 mbar, preferably from 30 to 60 mbar, in particular from 40 to 50 mbar), and also agitation and, where appropriate, post-drying at a constant elevated temperature (likewise at reduced pressure). The masterbatches are preferably charged batchwise in the desired blend together with the polymers of the base layer and/or outer layers and, where appropriate, with other raw material components, into a vacuum dryer which in the course of the drying period or residence time, traverses a temperature profile of from 10 to 160° C., preferably from 20 to 150° C., in particular from 30 to 130° C. During the residence time of about 6 hours, preferably 5 hours, in particular 4 hours, the mixture of raw materials is agitated at from 10 to 70 rpm, preferably from 15 to 65 rpm, in particular from 20 to 60 rpm. The resultant precrystallized and, respectively, predried mixture of raw materials is post-dried in a downstream vessel, likewise evacuated, at from 90 to 180° C., preferably from 100 to 170° C., in particular from 110 to 160° C., for from 2 to 8 hours, preferably from 3 to 7 hours, in particular from 4 to 6 hours.

In the preferred extrusion process for producing the film, the molten polymer material with the additives is extruded through a slot die and quenched, in the form of a substantively amorphous prefilm, on a chill roll. This film is then reheated and oriented longitudinally and transversely or transversely and longitudinally, or longitudinally, transversely, and again longitudinally and/or transversely. The stretching temperatures are generally above the glass transition temperature $T_g$ of the film by from 10 to 60° C. It is usual for the stretching ratio for longitudinal stretching to be from 2 to 6, in particular from 3 to 4.5, while that for transverse stretching is from 2 to 5, in particular from 3 to 4.5, and that for any second longitudinal or transverse stretching carried out is from 1.1 to 5. The first longitudinal stretching may also be carried out at the same time as the transverse stretching (simultaneous stretching). Heat setting of the film follows at oven temperatures of from 180 to 260° C., in particular from 220 to 250° C. The film is then cooled and wound up.

It was surprising that a film with hydrolysis resistance and high-temperature resistance and with the property profile required could be produced without any technical problems (such as caking in the dryer) by using masterbatch techology combined with suitable predrying and/or precrystallization and the use of hydrolysis stabilizers. No, or hardly any, die deposits or frame condensation was observed during the production process, and the film of the invention therefore has excellent optical properties, exceptionally good profile, and exceptionally good layflat. It has extremely good capability for orientation, and its production is therefore reliable and cost-effective. It is also highly surprising that it is even possible to reuse the regrind without any adverse effect on the Yellowness Index of the film. There is also no adverse change in the Yellowness Index, within the bounds of accuracy on measurement, when comparison is made with a film not provided with the appropriate materials.

It was also unexpected that even the flame-retardant embodiment of the film of the invention passes the automotive industry's heat/humidity test and does not become brittle.

The combined properties of the films of the invention make them suitable for many varied applications, for example in the indoor or outdoor sector, in the construction sector, or in the construction of exhibition stands, in the fitting out of shops or of stores, in the electronics sector, or in the lighting sector, for greenhouses, interior decoration, exhibition requisites, promotional requisites, illuminated advertising profiles, flexible conductors in the automotive industry, protective glazing for machines or for vehicles, flat cables, flexible printed circuits, capacitors, displays, placards, laminating media, blinds, or electrical applications.

The examples are used below to describe the invention in further detail, without limiting the same. Film properties were tested as follows:

Heat/humidity Test (Long-term Humidity Test)

In this test, the film was stored in an autoclave for 1000 h at 85° C. and 95% relative humidity at atmospheric pressure, followed by measurement of ultimate longitudinal and transverse tensile strengths to ISO 527-1-2.

Resistance to High Temperatures

Resistance to high temperatures was determined to IPC TM 650 2.4.9 after 1000 h of annealing at 130° C. in a circulating-air oven.

After storage or after the annealing in the heat/humidity test and, respectively, the high-temperature test, the ultimate tensile strength to ISO 527-1-2 must be above 100 N/mm² in order to meet automotive industry requirements.

Light Transmittance (Transparency)

For the purposes of the present invention, light transmittance is the ratio between the total transmitted light to the amount of incident light. Light transmittance was measured to ASTM D1003 using the ®HAZEGARD plus test equipment from Byk Gardener, Germany.

Haze

Haze is that percentage proportion of the transmitted light which deviates by more than 2.5° from the average direction of the incident light beam. Clarity is determined at an angle of less than 2.5°. The test equipment and the standard used to determine haze are the same as those for light transmittance.

Yellowness Index

Yellowness Index (YI) is the deviation from colorlessness in the "yellow" direction and was measured to DIN 6167.

Surface Defects

Surface defects were determined visually.

Mechanical Properties

Modulus of elasticity and ultimate tensile strength were determined longitudinally and transversely to ISO 527-1-2.

Shrinkage

Shrinkage was measured to DIN 40634 at 150° C. with a residence time of 15 minutes.

Standard Viscosity (SV) and Intrinsic Viscosity (IV)

Standard viscosity SV was measured by a method based on DIN 53726 on a 1% strength solution in dichloroacetic acid (DCA) at 25° C. SV (DCA)=($\eta_{rel}$−1)×1000. The intrinsic viscosity (IV) is calculated from the standard viscosity (SV) as follows IV=[$\eta$]=6.907 ·10⁻⁴SV(DCA)+0.063096 [dl/g]

Weathering (Bilateral), UV Resistance

UV resistance was tested as follows to the ISO 4892 test specification:

| Test equipment | Atlas Ci 65 Weather-Ometer |
|---|---|
| Test conditions | to ISO 4892, i.e. artificial weathering |
| Irradiation time | 1 000 hours (per side) |
| Irradiation | 0.5 W/m², 340 nm |
| Temperature | 63° C. |
| Relative Humidity | 50% |
| Xenon lamp | internal and external filter made from borosilicate |
| Irradiation cycles | 102 minutes of UV light, then 18 minutes of UV light with water spray on the specimens, then again 102 minutes of UV light, etc. |

Fire Performance

Fire performance was determined to DIN 4102, Part 2, construction materials class B2 and to DIN 4102 Part 1, construction materials class B1, and also to the UL 94 test.

Determination of Minimum Sealing Temperature

Hot-sealed specimens (sealed seam 20 mm×100 mm) were produced using Brugger HSG/ET sealing apparatus, by sealing the film at different temperatures with the aid of two heated sealing jaws at a sealing pressure of 2 bar and with a sealing time of 0.5 s. From the sealed specimens, test strips of 15 mm width were cut. The T-sealed seam strength was measured as in the determination of sealed seam strength. The minimum sealing temperature is the temperature at which a sealed seam strength of at least 0.5 N/mm² is achieved.

Sealed Seam Strength

To determine sealed steam strength, two film strips of width 15 mm were placed one on top of the other and sealed at 130° C. with a sealing time of 0.5 s and a sealing pressure of 2 bar (apparatus: Brugger model NDS, single-side-heated sealing jaw). The sealed seam strength was determined by the T-peel method.

EXAMPLES

The films in the examples and comparative examples below are in each case transparent films having one or more layers and produced on an extrusion line. Unless otherwise stated, the thickness of the films is in each case 75 µm. In all of the examples, unless otherwise stated, the polyethylene terephthalate content was reduced to the extent of the percentages by weight of the various additives.

The polyethylene terephthalate (clear polymer) from which the transparent film was produced had a standard viscosity SV (DCA) of 810, corresponding to an intrinsic viscosity IV (DCA) of 0.658 dl/g (RT49 polyethylene terephthalate from KoSa, Germany), or a standard viscosity SV (DCA) of 770, corresponding to an intrinsic viscosity IV (DCA) of 0.632 dl/g (4020 polyethylene terephthalate from KoSa, Germany).

The films were weathered bilaterally, in each case for 1000 hours per side, using the Atlas Ci 65 Weather-Ometer, to the ISO 4892 test specification, and then tested for mechanical properties, discoloration, surface defects, haze, and gloss.

The additives supplying hydrolysis protection and additional functionalities were fed in the form of various masterbatches:

| Masterbatch MB1: | |
|---|---|
| 6% by weight of | a phenolic hydrolysis stabilizer (® Irganox B561, a blend made from 80% by weight of Irgafos ® 168 and 20% by weight of ® Irganox 1010; Ciba Specialty Chemicals, Basle, Switzerland), and |
| 94% by weight of | polyethylene terephthalate (termed PET hereinafter) |

Bulk density: 750 kg/m³

| Masterbatch MB2: | |
|---|---|
| 20% by weight of | an aromatic polymeric carbodiimide (® Stabaxol P from Rhein Chemie, Mannheim, Germany), and |
| 80% by weight of | PET |

Bulk density: 750 kg/m³

The following masterbatch was used to produce UV-resistant films:

| Masterbatch MB3: | |
|---|---|
| 20% by weight of | 2-(4,6-diphenyl[1,3,5]-triazin-2-yl)-5-hexyloxyphenol (® Tinuvin 1577 from Ciba Specialty Chemicals), and |
| 80% by weight of | PET |

The following masterbatch was used to improve slip properties:

| Masterbatch MB4: |
|---|
| Comprising 10 000 ppm of ® Sylobloc-44H (Grace, Germany) alongside PET. |

The following masterbatch was used to produce a flame-retardant film:

| Masterbatch MB5: | |
|---|---|
| 25% by weight of | dimethyl methanephosphonate (® Amgard P1045 from Albright & Wilson Americas, USA), and |
| 75% by weight of | PET |

The following masterbatch was used to produce a transparent, colored film:

| Masterbatch MB6: | |
|---|---|
| 20% by weight of | Solvent Blue 35 (oil-soluble anthraquinone dye, ® Sudan Blue 2, BASF, Germany), and |
| 80% by weight of | PET |

Example 1

The monofilm produced comprised PET as main constituent, 0.2% by weight of silicon dioxide (Sylobloc®, Grace, Worms, Germany) as antiblocking agent, and 10% by weight of MB2.

To obtain uniform distribution, the silicon dioxide, which is insoluble in the PET, was incorporated into the PET by the raw material producer.

The PET had standard viscosity SV (DCA) of 810, corresponding to intrinsic viscosity IV (DCA) of 0.658 dl/g.

60% by weight of PET, 30% by weight of PET regrind, and 10% by weight of the masterbatch MB2 were charged at room temperature from separate feed vessels into a vacuum dryer, which traversed a temperature profile of from 25 to 130° C. from the time of charging to the end of the residence time. During the residence time of about 4 hours, the mixture of raw materials was agitated at 61 rpm.

The precrystallized or, respectively, predried mixture of raw materials was post-dried in the downstream hopper, likewise in vacuo, for 4 hours at 140° C. The film was then produced using the extrusion process described.

Example 2

A monofilm was produced as in Example 1 from 51% by weight of PET (RT49), 10% by weight of MB2, 4% by weight of MB4, and also 35% by weight of regrind directly associated with the process.

Example 3

The film from Example 2 was post-treated under almost zero tension in a heating oven at a temperature of 200° C. with a residence time of 60 seconds.

Example 4

The film from Example 2 was chemically post-treated on both sides with trichloroacetic acid.

Example 5

Modifying Example 1, the film comprised 2% by weight of MB1 and 10% by weight of MB2. The masterbatch was predried as described in Example 1, together with the other raw material components.

Example 6

The monofilm produced by a method similar to that of Example 2 comprised 5% by weight of MB2, 4% by weight of MB4, and 35% by weight of regrind, besides 56% by weight of RT49 PET. The mixture of raw materials was predried as described in Example 2.

Example 7

The film produced as in Example 1 comprised 0.2% by weight of silicon dioxide, 10% by weight of MB1, and 10% by weight of MB2.

Example 8

Coextrusion was used to produce a three-layer PET film with A-B-A layer sequence, B representing the core layer and A representing the outer layers. The thickness of the core layer was 71 μm, and that of each of the two outer layers was 2 μm. PET from Example 1 was used for the core layer and outer layers. The core layer also comprised 10% by weight of MB2, but no silicon dioxide. The outer layers, in contrast, comprised 0.2% by weight of silicon dioxide, but no hydrolysis stabilizer.

Example 9

Example 8 was repeated, but the two outer layers additionally comprised 5% of MB2.

Example 10

A hydrolysis-resistant A-B-A film was produced using the following mixing specification:

| | |
|---|---|
| Base layer (thickness 72 μm): | 55% by weight of 4020 PET, 10% by weight of MB2, and also 35% by weight of regrind directly associated with the process, and |
| Outer layers A (each 1.5 μm): | 83% by weight of 4020 PET, 7% by weight of MB4, and also 10% by weight of MB1. |

Comparative Example 1

A film was produced as in Example 1, but comprised no hydrolysis stabilizer.

Example 11

A film was produced as in Example 1, but additionally comprised 10% by weight of MB5. The proportion of PET was reduced correspondingly.

Example 12

A PET film having more than one layer was produced with the layer sequence A-B-A by a method similar to that of Example 8, but the thickness of the core layer was 73 μm and that of each of the two outer layers was 1 μm. The core layer comprised 10% by weight of MB2 and additionally 10% by weight of MB5 (flame retardant). No hydrolysis stabilizer(s) or flame retardants were present in the outer layers.

Example 13

As in Example 12, a coextruded A-B-A film was produced, the thickness of the core layer being 71 μm and that of each of the outer layers being 2 μm. The mixing specification for the core layer was identical with that of Example 12, and therefore the material comprised flame retardant and hydrolysis stabilizer, besides PET.

The mixing specification for the two outer layers corresponded to that of Example 12, but the material additionally comprised 5% by weight of MB5, but comprised no hydrolysis stabilizer.

Example 14

Example 11 was repeated with the single modification that the film also comprised 10% by weight of MB1, with an appropriately reduced proportion of PET. The masterbatch was predried as described in Example 1, together with the other raw material components.

Example 15

Example 12 was repeated with the single modification that the core layer now additionally comprised 10% by weight of MB1.

Example 16

A monofilm was produced in a manner similar to that of Example 11 and comprised 0.2% by weight of silicon dioxide, 5% by weight of MB5, and 10% by weight of MB2, besides PET.

Example 17

Example 12 was repeated with the modification that the core layer comprised 10% by weight of MB2 and 5% by weight of MB5.

Comparative Example 2

Example 11 was repeated, but no hydrolysis stabilizer was added. The monofilm therefore comprised 0.2% by weight of silicon dioxide, and also 10% by weight of MB5, besides PET.

Comparative Example 3

Example 3 of GB-A 2 344 596 was repeated (75 μm film with flame retardant and UV stabilizer).

Example 18

Example 2 was repeated with the modification that the film now comprised 3% by weight of MB5.

Example 19

The film from Example 18 was post-treated under almost zero tension in a heating oven at a temperature of 200° C. with a residence time of 60 seconds.

Example 20

The film from Example 18 was chemically post-treated on both sides with trichloroacetic acid, giving a reactive surface.

Example 21

Reverse gravure roll coating was used to coat both sides of the film from Example 2 with an aqueous dispersion, after longitudinal stretching. The dispersion comprised water and

| | |
|---|---|
| 4.20% of | hydrophylic polyester (PET/IPA polyester containing the sodium salt of 5-sulfoisophthalic acid, SP41, Ticona USA), |
| 0.15% of | colloidial silicon dioxide (®Nalco 1060, Deutsche Nalco Chemie, Germany) as antiblocking agent, and also |
| 0.15% of | ammonium carbonate (Merck, Germany) as pH buffer. |

The wet application weight was 2 $g/m^2$ per coated side. The calculated thickness of the coating after transverse orientation was 40 nm.

Example 22

A hydrolysis-resistant ABA film was produced using the following mixing specification:

| | |
|---|---|
| Base layer (thickness 72 μm): | 50% by weight of 4020 PET, 10% by weight of MB2, 5% by weight of MB3 and 35% by weight of regrind directly associated with the process, and |
| Outer layers A (each 1.5 μm): | 93% by weight of 4020 PET and 7% by weight of MB4. |

Example 23

In a manner similar to that of Example 22, a hydrolysis- and UV-resistant A-B-A film was produced using the following mixing specification:

| | |
|---|---|
| Base layer (thickness 72 μm): | 50% by weight of 4020 PET, 5% by weight of MB2, 3% by weight of MB3 and 35% by weight of regrind directly associated with the process, and |
| Outer layers A (each 1.5 μm): | 78% by weight of 4020 PET, 7% by weight of MB4, 10% by weight of MB1, and also 5% by weight of MB3. |

Example 24

Coextrusion was used to produce a sealable A-B-C film of 12 μm thickness, with a base layer B of 10 μm thickness made from 50% by weight of 4020 PET, 10% by weight of MB2, and also 40% by weight of regrind directly associated with the process.

The thermoplastic used for the sealable outer layer A, of thickness 1 μm, comprised a copolyester made from 78 mol % of ethylene terephthalate and 22 mol % of ethylene isophthalate (prepared by transesterification in the presence of a manganese catalyst, Mn concentration: 100 ppm). The outer layer also comprised 3.0% of masterbatch MB4 as antiblocking agent.

The outer layer C, 1 μm in thickness, comprised 7.0% by weight of masterbatch MB4, besides 93.0% by weight of 4020 PET.

Example 25

As described in Example 24, a hydrolysis-resistant, transparent, coextruded, sealable A-B-C film of thickness 12 μm was produced. In contrast to Example 24, reverse gravure roll coating was used to coat one side of the non-sealable outer layer C with an aqueous dispersion, after longitudinal stretching. The composition of the dispersion was as in Example 21. The wet application weight was 2 g/m². The calculated thickness of the coating after transverse stretching was 40 nm.

Example 26

The film produced as in Example 2 additionally comprised 7.5% by weight of MB6. It was corona-treated on one side. The intensity selected was such that the surface tension of the film after the treatment was above 45 mN/m.

The properties of the films of the invention are given in the tables below.

TABLE 1

(non-functionalized films)

| Properties | | | E1 | E2 | E3 | E4 | E5 | E6 | E7 | E8 | E9 | E10 | CE1 |
|---|---|---|---|---|---|---|---|---|---|---|---|---|---|
| Hydrolysis stabilizers | | number | 1 | 1 | 1 | 1 | 2 | 1 | 2 | 1 | 1 | 2 | 0 |
| Layers | | number* | 1 | 1 | 1 | 1 | 1 | 1 | 1 | 3 | 3 | 3 | 1 |
| Gloss | | outside | 155 | 156 | 151 | 100 | 160 | 157 | 153 | 185 | 170 | 176 | 150 |
| | | inside | 160 | 160 | 160 | 100 | 165 | 161 | 156 | 185 | 175 | 178 | 155 |
| Light transmittance/transparency | | % | 89 | 86 | 87 | 73 | 89 | 92 | 82 | 94 | 91 | 91 | 89 |
| Haze | | % | 14 | 16 | 17 | 25 | 13 | 12 | 21 | 2 | 2.5 | 3.5 | 13 |
| Yellowness Index (YI) | | | 2.4 | 2.6 | 2.5 | 2.5 | 2.3 | 1.4 | 2.9 | 1.8 | 2.0 | 2.1 | 1.7 |
| Modulus of elasticity | longitudinal | N/mm² | 4000 | 4000 | 4100 | 4100 | 4100 | 4050 | 4200 | 4100 | 4100 | 4000 | 4050 |
| | transverse | N/mm² | 5200 | 5100 | 5150 | 5100 | 5200 | 5200 | 5250 | 5250 | 5300 | 5100 | 5200 |
| Shrinkage | longitudinal | % | 1.3 | 1.3 | 0.6 | 1.3 | 1.2 | 1.2 | 1.4 | 1.0 | 1.2 | 0.9 | 1.4 |
| | transverse | % | 0.6 | 0.7 | 0.2 | 0.7 | 0.8 | 0.7 | 1.0 | 0.4 | 0.6 | 0.4 | 0.5 |
| Ultimate tensile strength | longitudinal | N/mm² | 170 | 170 | 180 | 165 | 175 | 170 | 180 | 170 | 170 | 175 | 175 |
| | transverse | N/mm2 | 280 | 270 | 275 | 270 | 275 | 270 | 270 | 285 | 285 | 275 | 275 |
| ditto after 1000 h at 130° C. | longitudinal | | yes | yes | yes | yes | yes | yes | yes | yes | yes | yes | no |
| | transverse | | yes | yes | yes | yes | yes | yes | yes | yes | yes | yes | no |
| ditto after 1000 h at 85° C. and 95 rel. humidity | longitudinal | | yes | yes | yes | yes | yes | yes | yes | yes | yes | yes | no |
| | transverse | | yes | yes | yes | yes | yes | yes | yes | yes | yes | yes | no |
| Elongation at break | longitudinal | % | 170 | 170 | 170 | 170 | 165 | 168 | 170 | 165 | 160 | 163 | 170 |
| | transverse | % | 90 | 90 | 90 | 93 | 95 | 101 | 100 | 95 | 90 | 92 | 95 |
| Reactive surface | | | | | | + | | | | | | | |

*Here and in the tables below, the term "number" refers to the number of layers obtained by extrusion or coextrusion, i.e. without taking account of any coatings applied subsequently
yes = test for resistance to high temperatures and, respectively, heat/humidity test passed, no = not passed

TABLE 2

(films functionalized using flame retardant)

| Properties | | | E11 | E12 | E13 | E14 | E15 | E16 | E17 | E18 | E19 | E20 | CE2 | CE3 |
|---|---|---|---|---|---|---|---|---|---|---|---|---|---|---|
| Hydrolysis stabilizers | | number | 1 | 1 | 1 | 2 | 2 | 1 | 1 | 1 | 1 | 1 | 0 | 0 |
| Layers | | number | 1 | 3 | 3 | 1 | 3 | 1 | 3 | 1 | 1 | 1 | 1 | 1 |
| Gloss | | outside | 160 | 175 | 170 | 150 | 165 | 165 | 170 | 154 | 154 | 115 | 160 | 150 |
| | | inside | 160 | 180 | 165 | 155 | 158 | 170 | 165 | 158 | 158 | 110 | 155 | 155 |
| Light transmittance/transparency | | % | 90 | 91 | 90 | 89 | 88 | 88 | 90 | 88 | 88 | 70 | 89 | 90 |
| Haze | | % | 14 | 3 | 3.2 | 15 | 3.2 | 14 | 3 | 15 | 15 | 28 | 14 | 13 |
| Yellowness Index (YI) | | | 2.4 | 2.4 | 2.5 | 2.6 | 2.7 | 2.3 | 2.1 | 2.3 | 2.3 | 2.0 | 2.1 | 2.0 |
| Modulus | longi- | N/mm² | 4000 | 4100 | 4000 | 4100 | 3900 | 4000 | 4100 | 4000 | 4000 | 4000 | 3800 | 4050 |

TABLE 2-continued (films functionalized using flame retardant)

| Properties | | | E11 | E12 | E13 | E14 | E15 | E16 | E17 | E18 | E19 | E20 | CE2 | CE3 |
|---|---|---|---|---|---|---|---|---|---|---|---|---|---|---|
| of elasticity | tudinal transverse | N/mm² | 5200 | 5200 | 5000 | 5050 | 5000 | 5100 | 5200 | 5100 | 5100 | 5100 | 4800 | 5050 |
| Shrinkage | longitudinal | % | 1.1 | 1.2 | 1.2 | 1.3 | 1.4 | 1.1 | 1.1 | 1.4 | 0.3 | 1.4 | 1.4 | 1.3 |
| | transverse | % | 0.5 | 0.6 | 0.5 | 0.6 | 0.5 | 0.6 | 0.5 | 0.6 | 0.1 | 0.6 | 0.5 | 0.8 |
| Ultimate tensile strength | longitudinal | N/mm² | 170 | 175 | 165 | 170 | 170 | 175 | 165 | 170 | 170 | 175 | 162 | 170 |
| | transverse | N/mm² | 280 | 275 | 270 | 285 | 185 | 270 | 270 | 270 | 270 | 275 | 250 | 255 |
| ditto after 1000 h at 130° C. | longitudinal | | yes | yes | yes | yes | yes | yes | yes | yes | yes | yes | no | no |
| | transverse | | yes | yes | yes | yes | yes | yes | yes | yes | yes | yes | no | no |
| ditto after 1000 h at 85° C. and 95% rel. humidity | longitudinal | | yes | yes | yes | yes | yes | yes | yes | yes | yes | yes | no | no |
| | transverse | | yes | yes | yes | yes | yes | yes | yes | yes | yes | yes | no | no |
| Elongation at break | longitudinal | % | 170 | 165 | 170 | 165 | 160 | 165 | 170 | 170 | 170 | 170 | 145 | 155 |
| | transverse | % | 90 | 100 | 100 | 95 | 90 | 95 | 100 | 90 | 90 | 90 | 85 | 95 |
| Flame retardance | | | ++ | ++ | ++ | ++ | ++ | ++ | ++ | ++ | ++ | ++ | ++ | 678 |

++ complies with fire protection requirements for classes B1 and B2, and for UL 94 test

TABLE 3

(other functionalizations)

| Properties | | | E21 | E22 | E23 | E24 | E25 | E26 |
|---|---|---|---|---|---|---|---|---|
| Thickness | | | 75 | 75 | 75 | 12 | 12 | 75 |
| Hydrolysis stabilizers | | Number | 1 | 1 | 2 | 1 | 1 | 1 |
| Layers | | Number | 1 | 3 | 3 | 3 | 3 | 1 |
| Gloss | | outside | 162 | 185 | 180 | 196 | 198 | 150 |
| | | inside | 168 | 185 | 180 | 200 | 202 | 158 |
| Light transmittance/transparency | | % | 87 | 94 | 88 | 95 | 91.4 | 83 |
| Haze | | % | 16 | 2.7 | 3.5 | 2.0 | 2.0 | 18 |
| Yellowness Index (YI) | | | 2.3 | 1.8 | 2.5 | 1.3 | 1.4 | — |
| Modulus of elasticity | longitudinal | N/mm² | 4000 | 4100 | 4100 | 4200 | 4200 | 4100 |
| | transverse | N/mm² | 5100 | 5150 | 5100 | 5000 | 5000 | 5150 |
| Shrinkage | longitudinal | % | 1.3 | 1.0 | 1.2 | 1.2 | 1.2 | 1.3 |
| | transverse | % | 0.6 | 0.3 | 0.4 | 0.3 | 0.3 | 0.6 |
| Ultimate tensile strength | longitudinal | % | 175 | 170 | 165 | 255 | 250 | 175 |
| | transverse | % | 275 | 270 | 270 | 250 | 250 | 270 |
| UV resistance/absorbance | | nm | <380 | <290 | <290 | <380 | <380 | <380 |
| Coating/adhesion | | | | ++ | | | ++ | |
| Minimum sealing temperature A/A | | ° C. | | | | 95 | 96 | |
| Sealed seam strength A/A | | N/mm² | | | | 2.3 | 2.4 | |
| Coloration | | | | | | | | blue |
| Surface tension | | mN/m | 40 | 40 | 40 | 40 | 40 | 48 |
| Heat/humidity test | | | yes | yes | yes | yes | yes | yes |
| Resistance to high temperatures | | | yes | yes | yes | yes | yes | yes |

++ = improved adhesion properties
yes = test passed

We claim:

1. A transparent, biaxially oriented and heat-set film having one or more layers and comprising, as main constituent, at least one crystallizable thermoplastic, said at least one crystallizable thermoplastic being a polyester or copolyester selected from the group consisting of polyethylene terephthalate (PET), polybutylene terephthalate (PBT), bibenzoyl-modified polyethylene terephthalate (PETBB), bibenzoyl-modified polybutylene terephthalate (PBTBB), wherein in the preparation of said polyester or copolyester use may also be made of isophthalic acid, cis-1,4-cyclohexane-dimethanol (c-CHDM), trans-1,4- cyclohexane-dimethanol (t-CHDM), or a mixture of cis-1, 4-cyclohexane-dimethanol and trans-1,4-cyclohexane-dimethanol (c/t-CHDM), wherein the film comprises a hydrolysis stabilizer consisting essentially of (1) a bond restoration agent consisting of either monomeric carbodiimides, aromatic polymeric carbodiimides having an amino group directly bonded to an aromatic ring, or oxazolines, and (2) optionally at least one of either a phenolic compound or an organic phosphite, said bond restoration agent present within said film in an amount ranging from about 0.2 to 3% by weight and said film exhibiting a Yellowness Index of less than 10.

2. The film as claimed in claim 1, wherein the phenolic compound is selected from the group consisting of a sterically hindered phenol, thiobisphenol, alkylidenebisphenol, alkylphenol, a hydroxybenzyl compound, an acylaminophenol, a hydroxyphenyl propionate and mixtures thereof.

3. The film as claimed in claim 1, wherein the proportion of the phenolic compound is from 0.1 to 8.0% by weight based on the weight of the film or, respectively, of the layer provided therewith within the film having more than one layer.

4. The film as claimed in claim 1, wherein the phenolic compound has been combined with at leant one organic phosphite.

5. The film as claimed in claim 4, wherein the ratio by weight of the phenolic compound to the organic phosphite is from 10:90 to 90:10.

6. A transparent, biaxially oriented and heat-set film having one or more layers and comprising, as main constituent, at least one crystallizable thermoplastic, said at least one crystallizable thermoplastic being a polyester or copolyester selected from the group consisting of polyethylene terephthlate (PET), polybutylene terephthalate (PBT), bibenzoyl-modified polyethylene terephthalate (PETBB), bibenzoyl-modified polybutylene terephthalate (PBTBB), and bibenzoyl-modified polyethlene napthalate (PENBB), wherein in the preparation of said polyester or copolyester use may also be made of isophthalic acid, cis-1,4-cylcohexane-dimethanol (c-CHDM), trans-1,4-cyclohexane-dimethanol (t-CHDM), or a mixture of cis-1, 4-cyclohexane-dimethanol and trans-1,4-cyclohexane-dimethanol (c/t-CHDM), wherein the film comprises as a further hydrolysis a phenolic compound, wherein the hydrolysis stabilizer is a mixture made from 0.1 to 5% by weight of polymeric aromatic carbodiimides and 0.1 to 5% by weight of a blend made from 30 to 90% by weight of an organic phosphite and 70 to 10% by weight of a hydroxyphenyl propionate.

7. The film as claimed in claim 1, which has been made UV-resistant, or flame-retardant, or on side or on both sides has been coated, or is sealable, and/or has been corona- or flame-treated.

8. The film as claimed in claim 7, wherein, the film, or at least one layer thereof, comprises a UV stabilizer.

9. The film as claimed in claim 8, wherein the UV stabilizer is 2-(4,6-diphenyl-[1,3,5]-triazin-2-yl)-5-hexyloxyphenol, 2,2'-methylenebis[6-benzotriazol-2-yl-4-(1,1,2,2-tetramethylpropyl)phenol]or 2,2'-(1,4-phenylene) bis[[3,1]benzoxazin-4-one].

10. The film as claimed in claim 8, wherein the proportion of the UV stabilizer is from 0.1 to 5.0% by weight based on the total weight of the at least one layer.

11. The film as claimed in claim 7, wherein the film, or at least one layer thereof, comprises a flame retardant.

12. The film as claimed in claim 11, wherein the flame retardant is a bromine compound, a chloroparaffin, or another chlorine compound, antimony trioxide, aluminum hydroxide, or an organic phosphorus compound.

13. The film as claimed in claim 11, wherein the proportion of the flame retardant is from 0.5 to 30.0% by weight based case on the weight of the layer of the crystallizable thermoplastic.

14. The film as claimed in claim 7, which additionally encompasses a sealable outer layer.

15. The film as claimed in claim 1, wherein the longitudinal and transverse shrinkage of the film after 15 minutes of heating to 150° C. are each loss than 1.5%.

16. A process for producing the film as claimed in claim 1, wherein a mixture which encompasses at least one crystallizable thermoplastic as main constituent and encompasses at least one hydrolysis stabilizer is melted in an extruder and shaped by extrusion or coextrusion to give a film having one or more layers, where the at least one hydrolysis stabilizer is added, prior to extrusion or coextruslon, in the form of a precrystallized or predried masterbatch.

17. The process as claimed in claim 16, wherein the substantively amorphous prefilm formed during extrusion is quenched on a chill roll, then reheated, oriented longitudinally and/or transversely, and finally heat-set.

18. A transparent, biaxially oriented and heat-set film having one or more layers and comprising, as main constituent, at least one crystallizable thermoplastic, wherein the film comprises a hydrolysis stabilizer composition consisting essentially of (i) at least one phenolic compound to retard the hydrolysis of ester bonds and (ii) at least one compound selected from either monomeric carbodIImides, polymeric carbodiimides or oxazolines to restore bonds previously broken by hydrolysis.

19. A transparent, biaxially oriented and heat-set film having one or more layers and comprising as main constituent, at least one crystallizable thermoplastic, wherein the film comprises a hydrolysis stabilizer composition consisting of (i) at least one phenolic compound to retard the hydrolysis of ester bonds and (ii) at least one compound selected from either monomeric carbodIImides, polymeric carbodiimides or oxazolines to restore bonds previously broken by hydrolysis, wherein maid hydrolysis stabilizer composition is supplied as at least one of either a (i) precrystallized or (ii) predried masterbatch, said film thus further comprising carrier polymer that has been at least one of either (i) precrystallized or (ii) predried.

20. A film according to claim 18, wherein said film contains up to 35% recycle formed from said film.

21. A transparent, biaxially oriented and heat-set film having one or more layers and comprising, as main constituent, at least one crystallizable thermoplastic, wherein the film comprises a hydrolysis stabilizer composition consisting of (i) at least one phenolic compound to retard the hydrolysis of ester bonds, (ii) at least one organic phosphite to degrade peroxides and (iii) at least one compound selected from either monomeric carbodIImides, polymeric carbodiimides or oxazoline to restore bonds previously broken by hydrolysis.

* * * * *